United States Patent [19]

Onogi et al.

[11] Patent Number: 4,658,375
[45] Date of Patent: Apr. 14, 1987

[54] EXPANDABLE SEQUENCE CONTROL SYSTEM

[75] Inventors: Toshiro Onogi, Tatsuno; Mamoru Hatakawa, Yawata; Hiroaki Fujimoto, Kadoma, all of Japan

[73] Assignee: Matsushita Electric Works Ltd, Japan

[21] Appl. No.: 655,694

[22] Filed: Sep. 28, 1984

[30] Foreign Application Priority Data

Sep. 30, 1983 [JP] Japan .................. 58-184211

[51] Int. Cl.$^4$ .................. G06F 13/00; G06F 1/00; H01R 11/00; H05K 7/00
[52] U.S. Cl. .................. 364/900; 364/708; 364/709; 364/710; 339/148; 339/150 T; 361/393; 361/426
[58] Field of Search ... 364/200 MS File, 900 MS File, 364/708, 709, 710; 361/392, 393, 413, 395, 426, 428; 235/1 D; 339/148, 150 T

[56] References Cited

U.S. PATENT DOCUMENTS

| | | | |
|---|---|---|---|
| 4,084,250 | 4/1978 | Albertine et al. | 364/708 |
| 4,092,730 | 5/1978 | Burkett et al. | 364/900 |
| 4,490,775 | 12/1984 | Quan | 361/406 |
| 4,503,484 | 5/1985 | Moxon | 361/395 |
| 4,558,914 | 12/1985 | Prager et al. | 361/393 |

Primary Examiner—Archie E. Williams
Assistant Examiner—William G. Niessen
Attorney, Agent, or Firm—Stevens, Davis, Miller & Mosher

[57] ABSTRACT

An expandable sequence control system including a central controller unit for sequentially controlling a plurality of I/O devices connected thereto through a plurality of I/O interface modules is disclosed herein. A terminal block is formed on each I/O interface module for connection between the interface module and the I/O devices. Each of the I/O interface modules is provided at its opposite ends with respective ports which are to be electrically coupled to the central controller unit or connected to each other by means of flexible cables. These ports of each I/O interface module are electrically interconnected through a feeder passage incorporated therein such that a desired number of the I/O interface modules can be added to the system by coupling the feeder passages thereof with the flexible cable connecting between the ports of adjacent I/O interface modules. Accordingly, a plurality of the I/O interface modules can be arranged in tandem or parallel relationship with each other depending on the requirements of a space in which the system is to be installed, giving rise to flexibility in arranging the plural I/O interface modules in a limited space.

7 Claims, 9 Drawing Figures

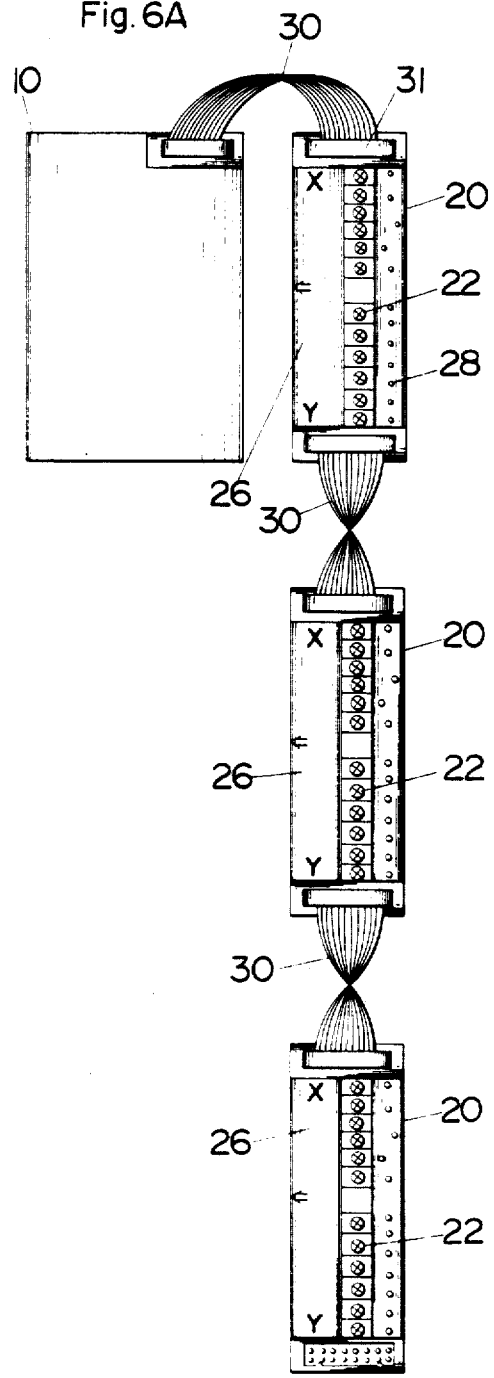

EXPANDABLE SEQUENCE CONTROL SYSTEM

BACKGROUND OF THE INVENTION

1. Field of the Invention

The present invention is directed to an expandable sequence control system, and more particularly to a sequence control system having a central controller unit and a plurality of separate I/O interface modules to which a plurality of I/O devices are connected for being sequentially controlled by the central controller unit and which are interconnected by means of flexible cables.

2. Description of the Prior Art

Sequence control systems have recently been required to control an increased number of I/O devices, such as machines or sensors, with a single central controller unit so as to meet a sophisticated combination of the devices being controlled in a modern assembly line or other industrial operations. For this purpose, it is a common practice to add to the system a plurality of I/O interface modules having terminals for connection with the I/O devices. Exemplary of the prior system having a plurality of the I/O interfaces is schematically shown in FIG. 1, in which a central controller unit 1 and I/O interface modules 2 are mounted together on a mother board 3 with edge connectors 4 projecting on the bottom thereof inserted in corresponding sockets 5 formed on the mother board 3 so that the central controller unit 1 and the I/O interface modules 2 are interconnected by way of a bus line incorporated in the mother board. Each of the I/O interface modules 2 is provided on its top face with a terminal block 6 for connection with plural I/O devices to be controlled by the central controller 1. The combination of the edge connectors and the sockets can facilitate the interconnection of the I/O interface modules for the purpose of expanding the system, however, it should result in a fixed disposition of the I/O interface modules on the mother board, affording no flexibility in spatial arrangement of the I/O interface modules. In fact, such flexibility may be required and most preferable for easy and proper wiring operation between the I/O interface modules and the corresponding I/O devices located on different sites as well as for space-saving purposes when a large number of the I/O devices are to be connected to the central controller unit using a corresponding number of the I/O interface modules.

SUMMARY OF THE INVENTION

The above inconvenience has been eliminated in an expandable sequence control system in accordance with the present invention. The system includes a central controller unit and plural I/O interface modules of unique construction which are detachably coupled to the central controller unit and to each other by means of flexible cables. Each of the I/O interface modules is provided with terminal means for connection with I/O devices being sequentially controlled by the central controller unit. Also formed at the opposite ends of each I/O interface module are ports which are electrically interconnected by a feeder passage incorporated in that I/O interface module and which are adapted to be electrically connected respectively to said cables. With this arrangement, a plurality of the I/O interface modules thus constructed can be interconnected by joining the ports of the adjacent modules with the cables such that the individual feeder passages are added to substantially form a single extended bus line from the central controller unit, thus allowing a great number of the I/O devices to be connected through the extended bus line to the controller unit without providing any additional ports on the side of central controller unit. Thus, a desired number of the I/O interface modules can be easily added to the system to expand the capacity thereof and at the same time the modules can be disposed in rather free positions, for example, as being disposed in tandem or parallel relationship with each other. This provides flexibility in spatial arrangement of the plural I/O interface modules, facilitating the wiring between the each of the I/O interface modules and the corresponding I/O devices installed on different sites and as well reducing the space required for accommodating the entire system.

Accordingly, it is a primary object of the present invention to provide an expandable sequence control system which allows a relatively free disposition of the I/O interface modules for facilitating the wiring with I/O devices to be controlled by a central controller unit and as well for space-saving installation of the plural I/O interface modules.

In a preferred embodiment, said terminal means is defined by an elongated terminal block which is offset on one side of the I/O interface module to define on the other side thereof a wiring space for connection with the I/O devices, rendering the I/O interface module to be laterally unidirectional in the sense of providing a neat arrangement of field wires connecting the I/O devices to the individual I/O interface modules or of preventing the jamming between the wires connected to the one I/O interface module and those to the adjacent ones. Therefore, the plural I/O interface modules are required to be oriented toward the same lateral direction whether they are in tandem or parallel arrangement. To this end, a plurality of contacts forming said port at one end of each I/O interface module are arranged in point symmetry relation with those forming the port at the other end of that interface module, whereby each of the plugs formed on both ends of the flexible flat cable employed can be correctly adapted in any one of two ports at the opposite ends of the I/O interface module. This enables the plural I/O interface modules to be disosed in laterally identical orientation as employing the flat cables of the identical type whether they are in tandem or parallel arrangement simply by reversing the ports at the opposite ends of alternately disposed I/O interface modules between said tendem and parallel arrangements.

It is therefore another object of the present invention to provide an expandable sequence control system which enables the plural I/O interface modules to assume laterally identical orientation for neat wiring puroses whether they are in tandem or parallel arrangement, yet requiring only the one type for the flat cables.

The above and other advantages of the present invention will be more apparent from the following detailed description of the preferred embodiment of the present invention when taken in conjunction with the accompanying drawings.

BRIEF DESCRIPTION OF THE DRAWINGS

FIG. 6A is a plane view of the system when the I/O interface modules are disposed in tandem relationship with each other;

DETAILED DESCRIPTION OF THE EMBODIMENT

Figure 1:
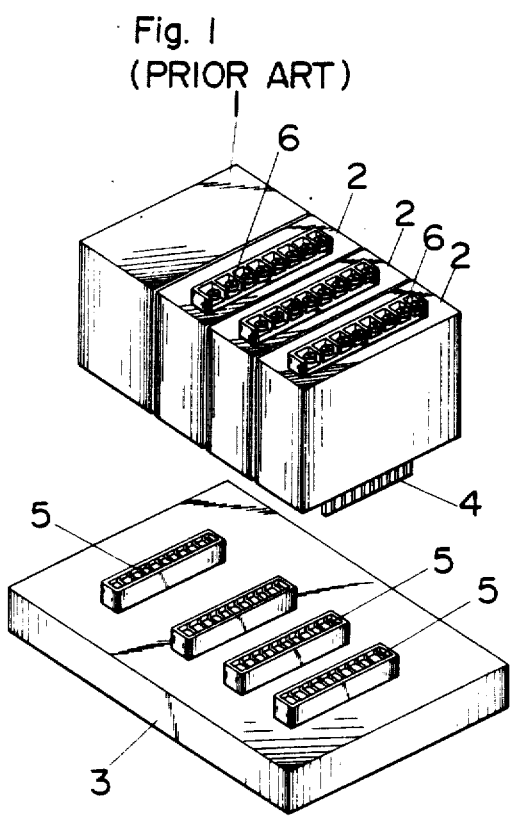
FIG. 1 is a perspective view of a prior art sequence control system.
Figure 2:
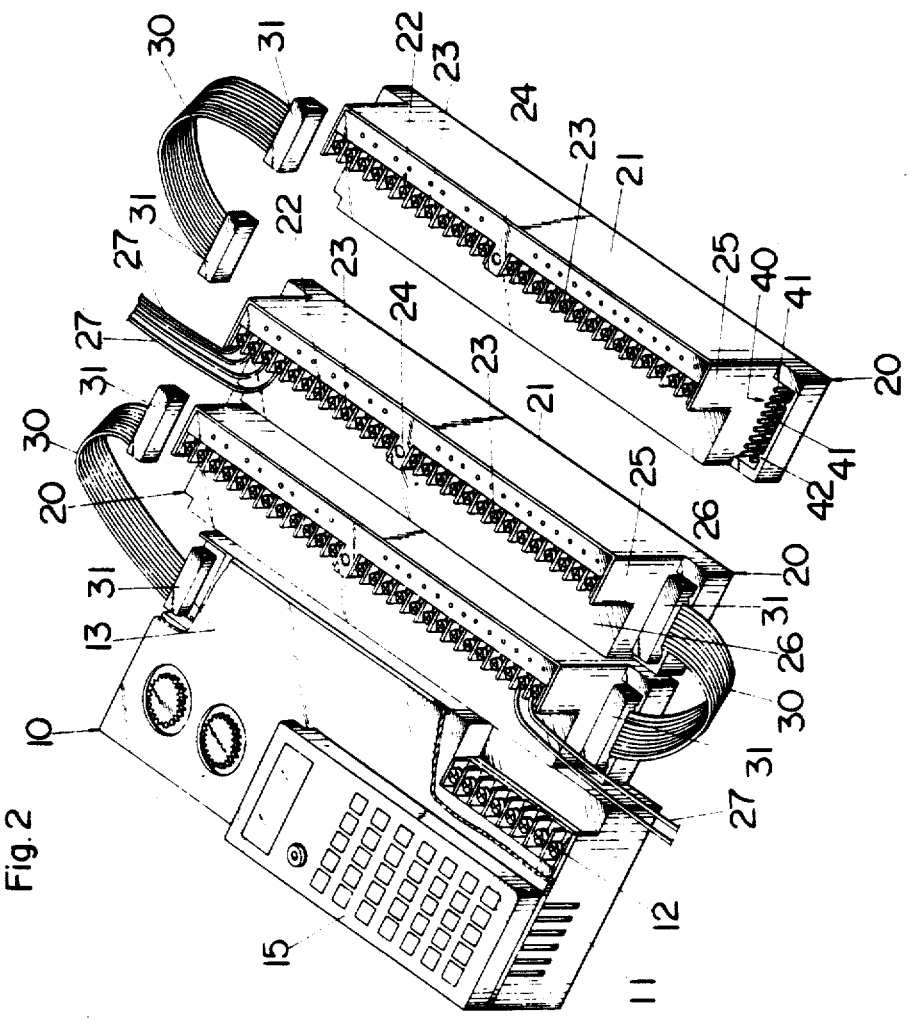
FIG. 2 is a perspective view of an expandable sequence control system in accordance with a preferred embodiment of the present invention.

Referring now to FIG. 2, there is shown an expandable sequence control system in accordance with a preferred embodiment of the present invention. The system comprises a central controller unit 10, a plurality of I/O interface modules 20, and a corresponding number of flat cables 30 adapted to couple one of the I/O interface modules 20 to the central controller unit 10 and to couple the I/O interface modules 20 to each other. Said central controller unit 10 comprises an elongated casing 11 incorporating therein a CPU, PROM and other necessary electric components and being provided with a power input terminal 12 and a port 13 for connection with one of the I/O interface modules 20. A programmer 15 with a keyboard is removably mounted on the top of the casing 11 and is cooperative with the PROM so as to make the central controller unit 10 as a programmable controller for sequentially controlling various I/O devices (not shown), for example, machines and sensors, connected thereto in a programmed manner.

Each of the I/O interface modules 20 comprises an elongated housing 21 having the same length and depth as the central controller unit 10 but having a reduced width. Provided on the top face of the housing 21 is a terminal block 22 composed of a number of terminals 23 which are spaced longitudinally along the lateral side of the housing 21 and are divided into two groups of terminals interrupted by a rib 24, one for the input devices and the other for the output devices. Said terminal block 22 is formed on a raised platform 25 which is offset on one side of the housing 21 to define on the other side thereof a recessed portion 26. The recessed portion 26 serves as a wiring space for field wires 27 interconnecting the individual terminals 23 and the corresponding I/O devices so that a number of field wires 27 can be neatly received therein as extending therefrom without being tangled. In this sense, all the I/O interface modules 20 employed are preferred to be disposed with the recessed portion 25 identically oriented for avoiding the jamming between the field wires 27 from one of the I/O interface modules 20 and the adjacent one, that is, each of the I/O interface modules 20 is shaped to be laterally asymmetric and is rather required to be arranged in laterally identical orientation with respect to the other modules 20. Exposed in the top face of said platform 25 are plural LEDs 28 indicating the operations of the I/O devices connected to particular terminals 23.

Figure 3:
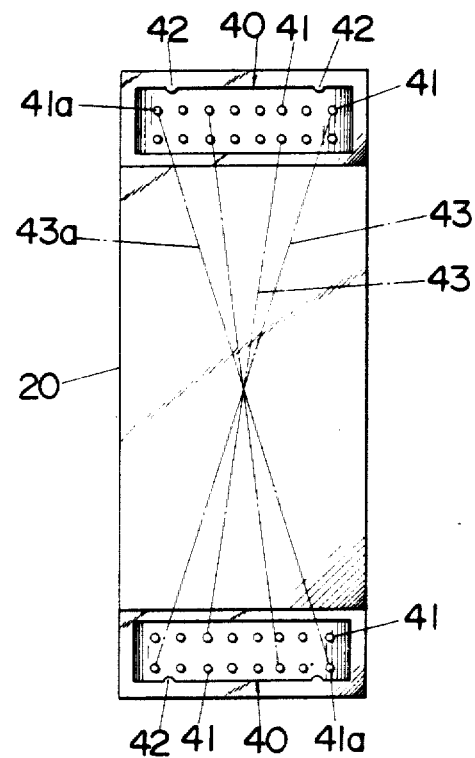
FIG. 3 is a schematic view of an interior wiring arrangement in greatly simplified representation of an I/O interface module employed in the above system.
Figure 4:
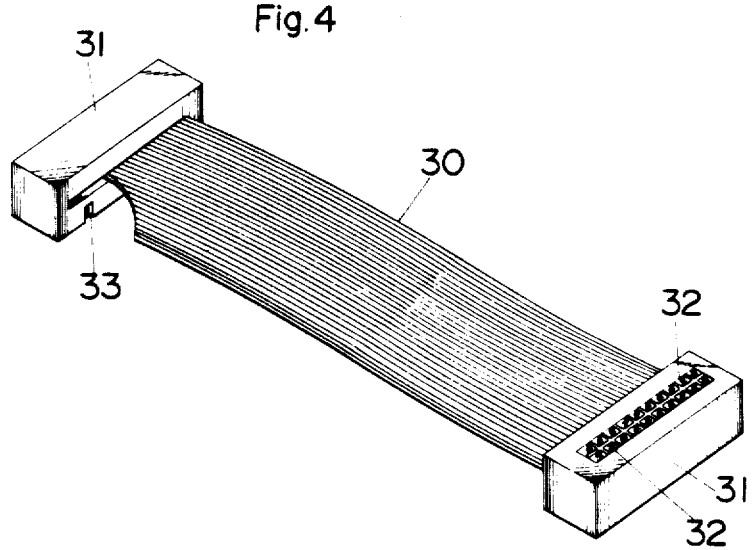
FIG. 4 is a perspective view, partially cut away, of a flat cable employed in tha above system.

At the both longitudinal ends of each I/O interface modules 20 there are formed respective ports 40 of identical construction for connection with said flat cables 30. Said port 40 is in the form of an top-open receptacle including therein a number of contact pins 41 arranged in two rows and guide ribs 42 projecting inwardly from one peripheral edge thereof, as best shown in FIG. 3. Provided at the both ends of each flat cable 30 are plugs 31 of identical construction each of which has a corresponding number of contact sockets 32 likewise arranged in two rows to receive said contact pins 41 of the port 40 for electrical connection therebetween and has a pair of grooves 33 receiving respectively said guide ribs 42 when inserted in said port 40 for ensure position-correct connection, one of the plugs 31 of each flat cable 30 having its connection face opposite to that of the other plug 31, as shown in FIG. 4. It is to be noted at this time that the port 13 of the central controller unit 10 has the identical construction to those of the I/O interface modules 20 so that only one type for the flat cables 30 is enough in the present system.

Figure 6B:
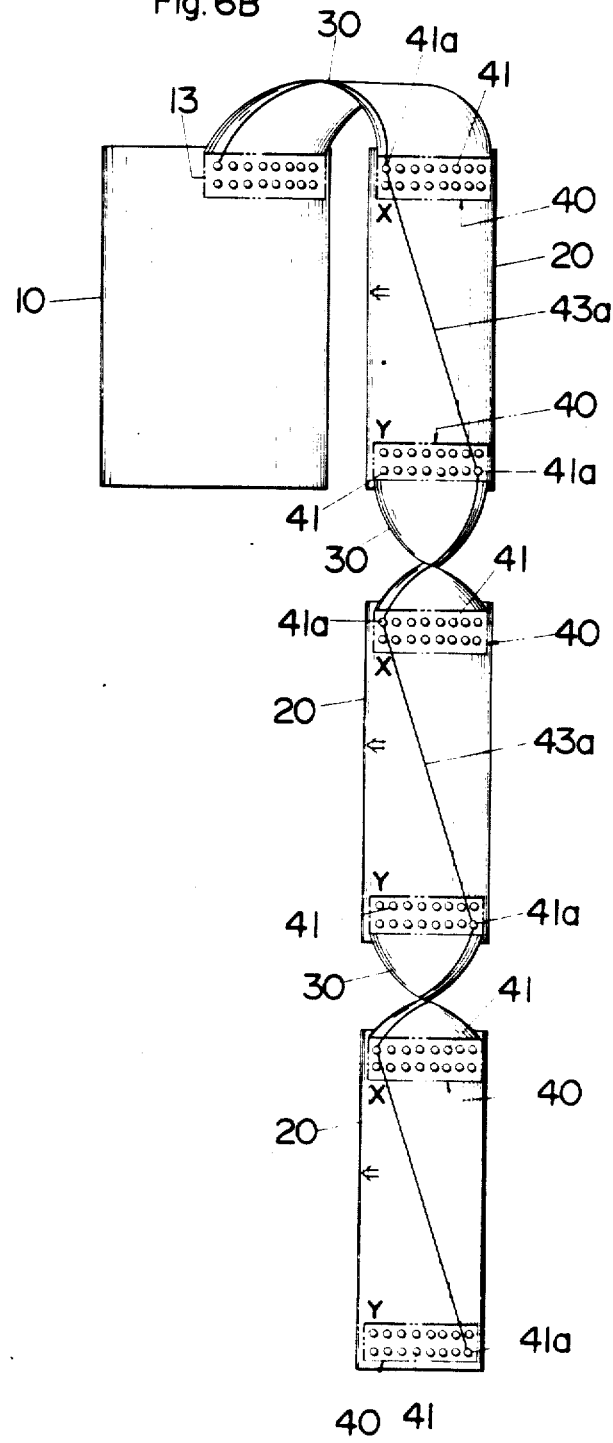
FIG. 6B is a schematic representation showing a wiring arrangement of FIG. 6A.
Figure 7:
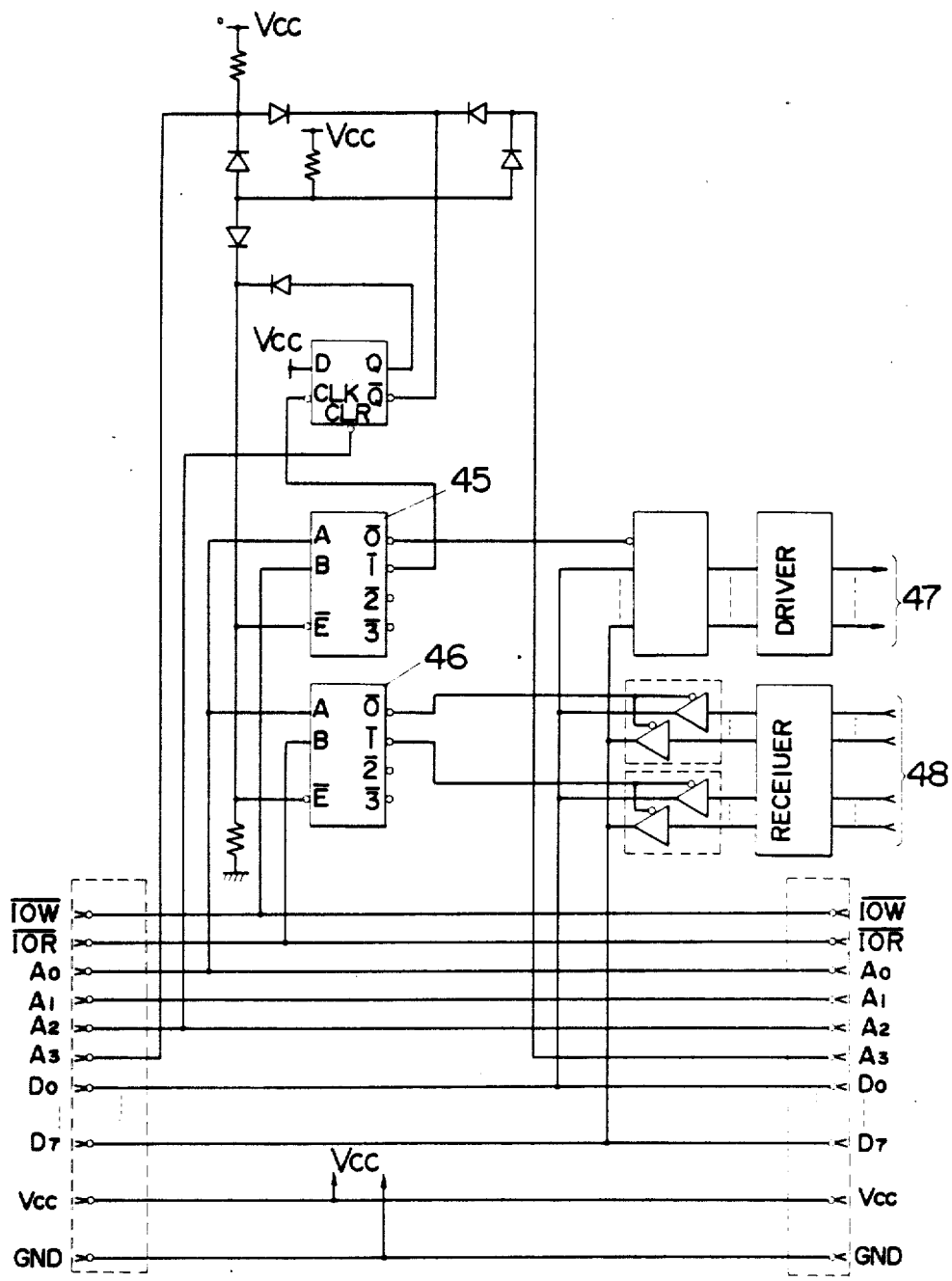
FIG. 7 is a circuit diagram of the above I/O interface module.

The contact pins 41 of the ports 40 at both ends of each I/O interface module 20 are interconnected respectively by a corresponding number of feeder lines 43 defining a feeder passage passing within the I/O interface module 20, while said terminals 23 are connected respectively to the feeder lines 43 through suitable buffers. The detailed wiring diagram of the I/O interface module 20 is shown in FIG. 7 in which numerals 45 and 46 designate decoders, and numeral 47 and 48 designate respectively the groups of terminals for the input devices and for the output devices. Thus, connecting the plural I/O interface modules 20 with said flat cables 30 will result in the added feeder passages which forms an extended bus line from the central controller unit 10, enabling the addition of a desired number of the I/O interface modules 20 to the system depending on the number of the I/O devices to be controlled without requiring the provision of any additional connection ports on the side of the central controller unit 10. As shown in FIG. 3, the contact pins 41 of the ports 40 at both ends of each I/O interface module 20 are arranged in point symmetrical reltionship with one another, for example, the upper left contact in 41a of the upper port 40 is connected by the feeder line 43a to the lower right contact pin 41a of the lower port 40, when viewed in the drawings, so that said plug 31 on either end of the flat cable 30 can be adapted to be connected correctly to any one of the two ports of each I/O interface modules 20. This enables the plural I/O interface modules 20 to be disposed in laterally identical orientation with each other, only by the use of the flat cables 30 of the same construction, whether they are in parallel arrangement, as shown in FIGS. 5A and 5B, or in tandem arrangement, as shown in FIGS. 6A and 6B.

Figure 5A:
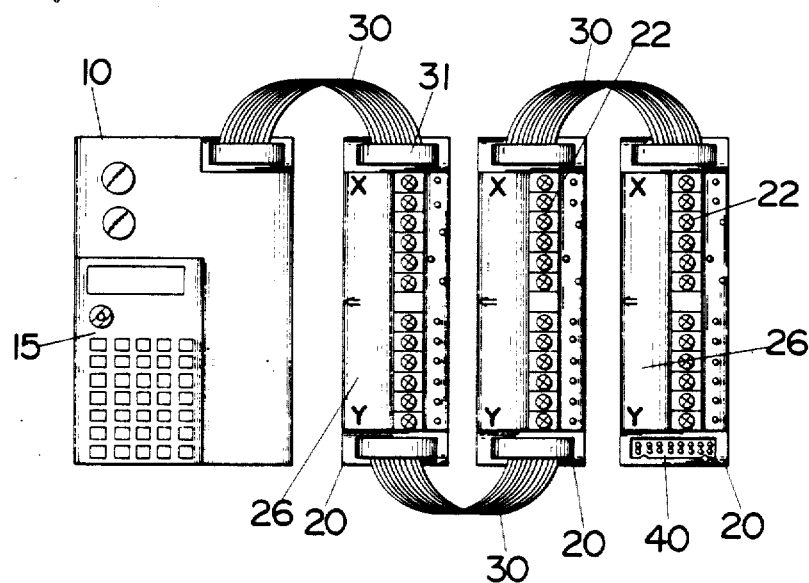
FIG. 5A is a plane view of the system when the plural I/O interface modules are disposed in parallel relationship with each other.
Figure 5B:
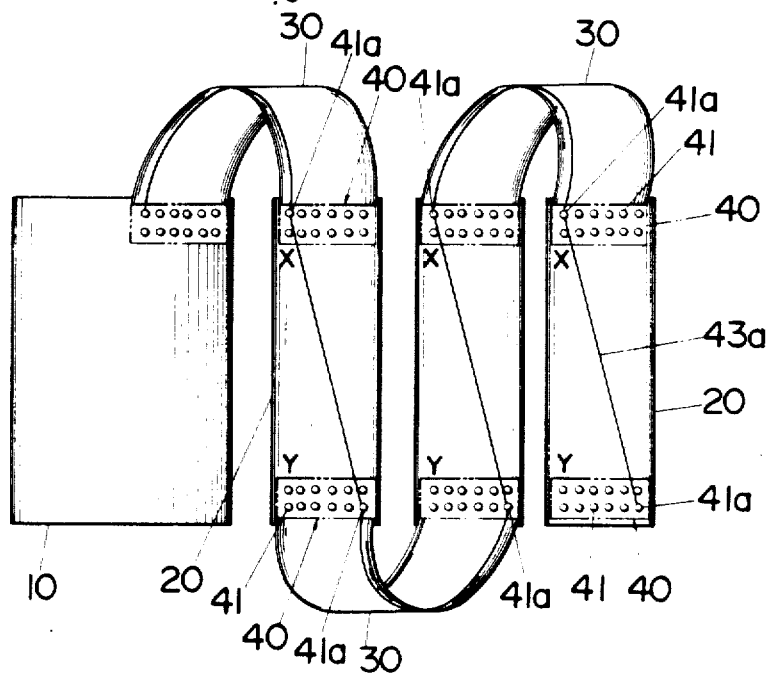
FIG. 5B is a schematic representation showing a wiring arrangement of FIG. 5A.

More detailed explanation as to the above will be discussed hereinafter, when connecting the I/O interface modules 20 in parallel arrangement, the connection between the adjacent ones by the flexible cable 30 is such that, as shown in FIGS. 5A and 5B, the port 40 at one end indicated by X or Y of the I/O interface module 20 is coupled to the port 40 at the same end X or Y of the other module 20. That is, in this parallel arrangement, the plural I/O interface modules are arranged either in X—X or Y—Y connection. In contrast to the above, when connecting the I/O interface modules 20 in tandem arrangement, the adjacent ones are arranged in X-Y or Y-X connection. In other words, the conversion between the parallel and tandem arrangements as aligning the lateral orientation of the I/O interface modules 20 can be made by simply reversing or rotating every other I/O interface modules 20, which is made possible by said point symmetrical arrangement of the contact pins 41 between the ports 40 at both ends of the I/O interface module 20. Therefore, the ports 40 or the contact pins 41 thereof can be maintained in correct electrical connection with each other whether the I/O interface modules 20 are in parallel or tandem arrangement, eliminating the possibility of incorrect connection while assuring laterally identical orientation of the I/O interface modules.

What is claimed is:

1. An expandable sequence control system, comprising:
    a central control unit for controlling a plurality of input/output devices;
    at least one input/output interface module, each module being connectable to said central control unit directly or through another module, each module having terminals to which a plurality of input/output devices are connectable, each module having an internal bus and an electrical circuit connected with said terminals which enables the coupling of input/output devices connected to said terminals to said bus which is in turn connectable to said central control unit, each module having two connection ports which are electrically connected to said bus and to said electrical circuit in a manner which permits connection of either port directly to said central control unit or directly to either port of another like module, while fully maintaining the ability of said input/output devices to be coupled to said central control unit through said bus; and
    at least one flexible cable for connecting a port of each said module to one of said central control unit and either port of another like module.

2. An expandable sequence control system as in claim 1, wherein said flexible cable has at its opposite ends respective end plugs which are connectable to said central control unit or either port of each module, a first port of each module having a plurality of contacts which are arranged in point symmetry relationship with those of a second port of each module, whereby the plugs of each flexible cable can be correctly connected to either of the two ports of each module.

3. An expandable sequence control system as in claim 2, wherein said first and second ports are provided on opposite ends of each module.

4. An expandable sequence control system as in claim 2, wherein said flexible cables are flat cables.

5. An expandable sequence control system as in claim 2, comprising a plurality of modules and flexible cables, said flexible cables interconnecting said modules together in a parallel relationship and interconnecting said modules to said central controller unit.

6. An expandable sequence control system as in claim 2, comprising a plurality of modules and flexible cables, said flexible cables interconnecting said modules together in a tandem relationship and interconnecting said modules to said central controller unit.

7. An input/output interface module for use with a process controller, said module comprising:
    terminals to which a plurality of input/output devices are connectable;
    a data bus;
    a connection circuit connected to said terminals for enabling the coupling of input/output devices connected to said terminals to said process controller through said bus; and
    a pair of connection ports for connecting said module in circuit with other like modules or with said process controller, said connection ports being electrically connected within said module to said bus and to said connection enabling circuit in a manner which permits connection of either port directly to a process controller or directly to either port of another like module, while fully maintaining the connection enabling operations of said connection circuit.

* * * * *